United States Patent [19]
Girmay

[11] Patent Number: 5,130,565
[45] Date of Patent: Jul. 14, 1992

[54] SELF CALIBRATING PWM UTILIZING FEEDBACK LOOP FOR ADJUSTING DUTY CYCLES OF OUTPUT SIGNAL

[75] Inventor: Girmay K. Girmay, Inglewood, Calif.

[73] Assignee: Xerox Corporation, Stamford, Conn.

[21] Appl. No.: 756,241

[22] Filed: Sep. 6, 1991

[51] Int. Cl.[5] .............................................. H03K 5/04
[52] U.S. Cl. ....................................... 307/265; 328/58
[58] Field of Search ....................... 307/265, 268, 271; 328/58, 61, 155; 377/39, 56

[56] References Cited

U.S. PATENT DOCUMENTS

| | | | |
|---|---|---|---|
| 4,023,660 | 5/1977 | Dickinson | 377/2 |
| 4,370,067 | 1/1983 | Iwakura et al. | 307/265 |
| 4,599,569 | 7/1986 | Furuhata et al. | 307/265 |
| 4,870,665 | 9/1989 | Vaughn | 328/58 |

Primary Examiner—Stanley D. Miller
Assistant Examiner—Toan Tran
Attorney, Agent, or Firm—Robert E. Cunha

[57] ABSTRACT

A circuit for producing an exact duty cycle for a system having a variable system clock frequency. In the calibrate phase, a waveshape with an exact duty cycle is made by ANDing two or more clock pulse trains, each of which is a multiple of the system clock frequency. This is compared against the output of a current-controlled pulse width modulator which is programmed to produce the same duty cycle. The polarity of the comparator output as a result of the error between the exact duty cycle and the one produced by the modulator increments or decrements a counter, the output of which controls a DAC, which in turn corrects the output of the modulator. After a suitable number of interations, the modulator, which is now calibrated, will reproduce the exact duty cycle. The circuit is then put into the operate mode by disabling the counter, and programming the pulse width modulator to output the desired system duty cycle.

3 Claims, 7 Drawing Sheets

SELF CALIBRATING PWM UTILIZING FEEDBACK LOOP FOR ADJUSTING DUTY CYCLES OF OUTPUT SIGNAL

BACKGROUND OF THE INVENTION

This invention is a circuit for calibrating the duty cycle of a pulse width modulation system and more particularly is a closed loop feedback system for adjusting the duty cycle of a current controlled pulse width modulator to compensate for the long term variations of the system clock.

In a laser printer, a fixed frequency data clock can not be used since the data rate must be variable to make up for the tolerances in the system. For example, such things as the image size and the rotational speed of the polygon can not be kept exactly constant, and therefore the data clock rate must be varied to compensate.

A complication arises in a tri-state printer which deposits two different colorants onto the output hard copy in one pass. The colors are typically black and a highlight color of red, green or blue. In a tri-state xerographic system one of the toners is charged positively and the other is charged negatively. Then, by charging the photoreceptor with either positive or negative charges, two colorants can be applied to the photoreceptor in one pass. More specifically, the photoreceptor is originally charged to a first voltage, and then discharged either 0% for one colorant or 100% for the other colorant. In this system it is assumed that if the photoreceptor is discharged approximately 50%, it will attract neither colorant, and the result will be white, the color of the typical paper medium. Actually, the exact percent of discharge needed to get a pure white color may vary, depending on the individual system characteristics. Values of 15% to 70% are common, where 100% is full highlight color and 0% is black.

Once the correct level has been found, it is critical that it be maintained. For example, if the highlight color is red and the white level is excceeded by only a few percent, the whole page will have a pink tint. In addition, as the frequency of the clocked data changes, the On and OFF times must vary accordingly to maintain the exact duty cycle.

The amount of discharge is produced by pulse width modulation. For each pixel, the light will be on for a part of the time and off for the remainder. The actual duty cycle required for each system can be expressed as a binary number. For example, a duty cycle of 62½%, expressed as an six bit number, would be 101000.

Setting the duty cycle of a pulse modulation system is not difficult in a system with a fixed frequency clock. The complication here is that the system clock, as explained above, is also variable. The requirement here is that the ON time must be varied as the system clock frequency varies so that the duty cycle will remain constant while the clock frequency is allowed to change.

SUMMARY OF THE INVENTION

One input to this circuit is a binary calibration number. As an example, let us assume that the circuit calibration number is 75%, expressed as a binary number, 110000. This number is applied to a pulse width modulation circuit to ultimately produce a first delayed waveshape.

The other input is a set of system clock pulses of any frequency. The first clock is a square wave, the positive half of which coincides to one frame, or pixel, the second negative half of which corresponds to the next pixel. The second clock frequency is double the first and the third clock frequency is double the second. The second and third waveshapes and ANDed together to produce a second delayed waveshape that is ON exactly 75% of the time.

The first and second delayed waveshapes are compared, and if the falling edge of the first occurs earlier, a counter is counted down. If the falling edge of the second occurs earlier, the counter is counted up. Finally, the counter output is used to control the pulse width modulation circuit, ultimately to produce its delayed output at exactly the same time as that produced by the added clock pulses. The result is that, for any system clock pulse frequency, an input number of 0.75 results in an output duty cycle of 75%.

Having completed the calibration of the circuit, the counter is disabled from further counting, and the calibration binary number is removed and substituted with a number which corresponds to the desired duty cycle, which the circuit will now produce accurately. In this way, the circuit will produce an accurate duty cycle at any clock frequency.

DETAILED DESCRIPTION OF THE INVENTION

Figure 1:
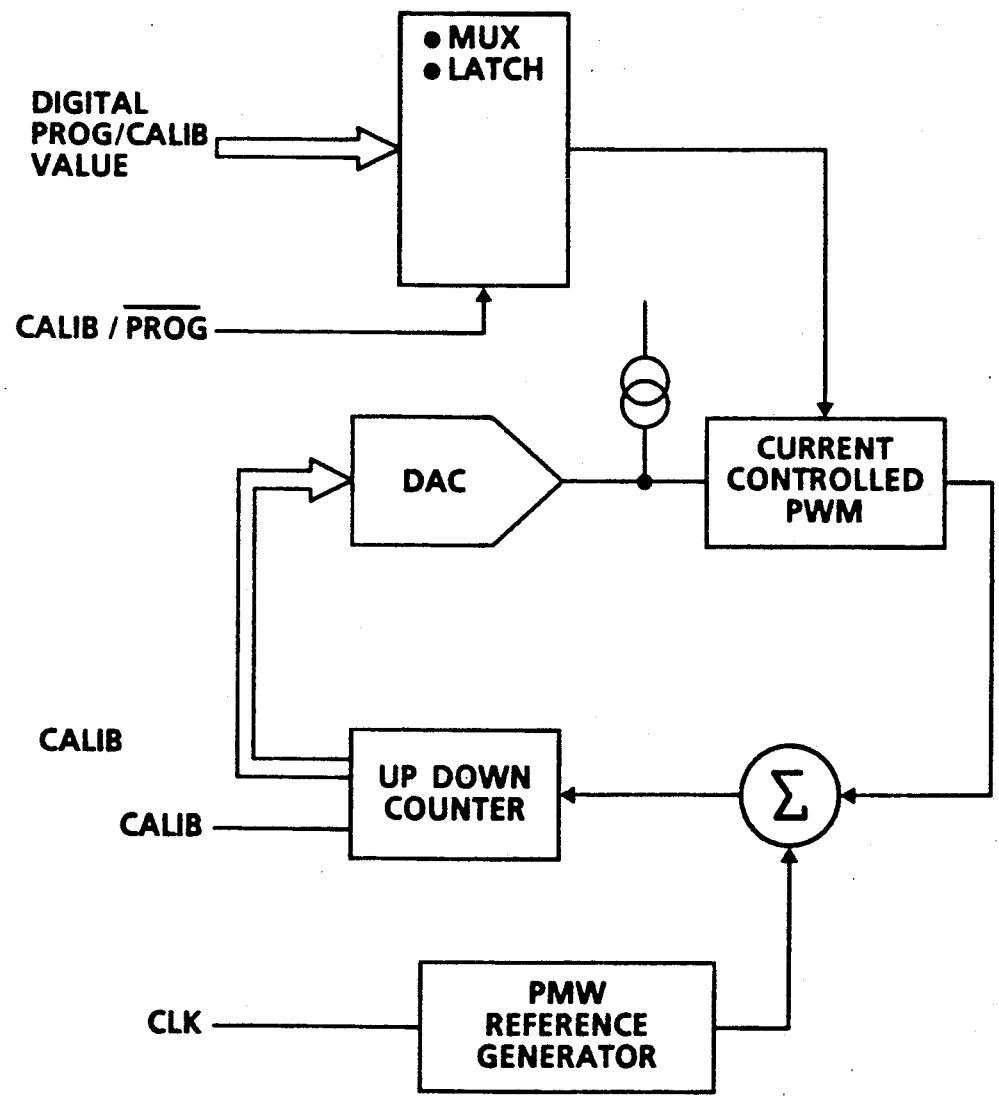
FIG. 1 is a simplified block diagram.
Figure 2A:
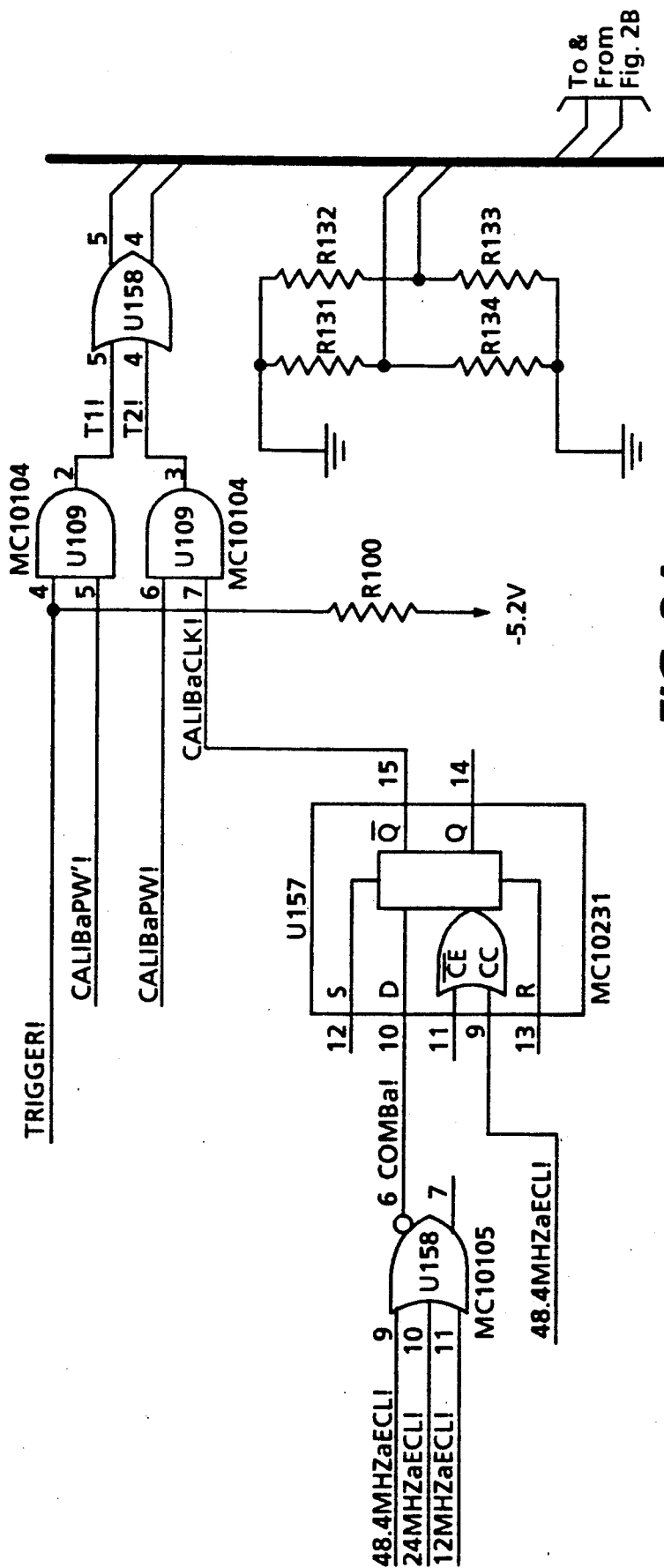
FIGS. 2A-2E are detailed schematic diagrams of the circuit.
Figure 2B:
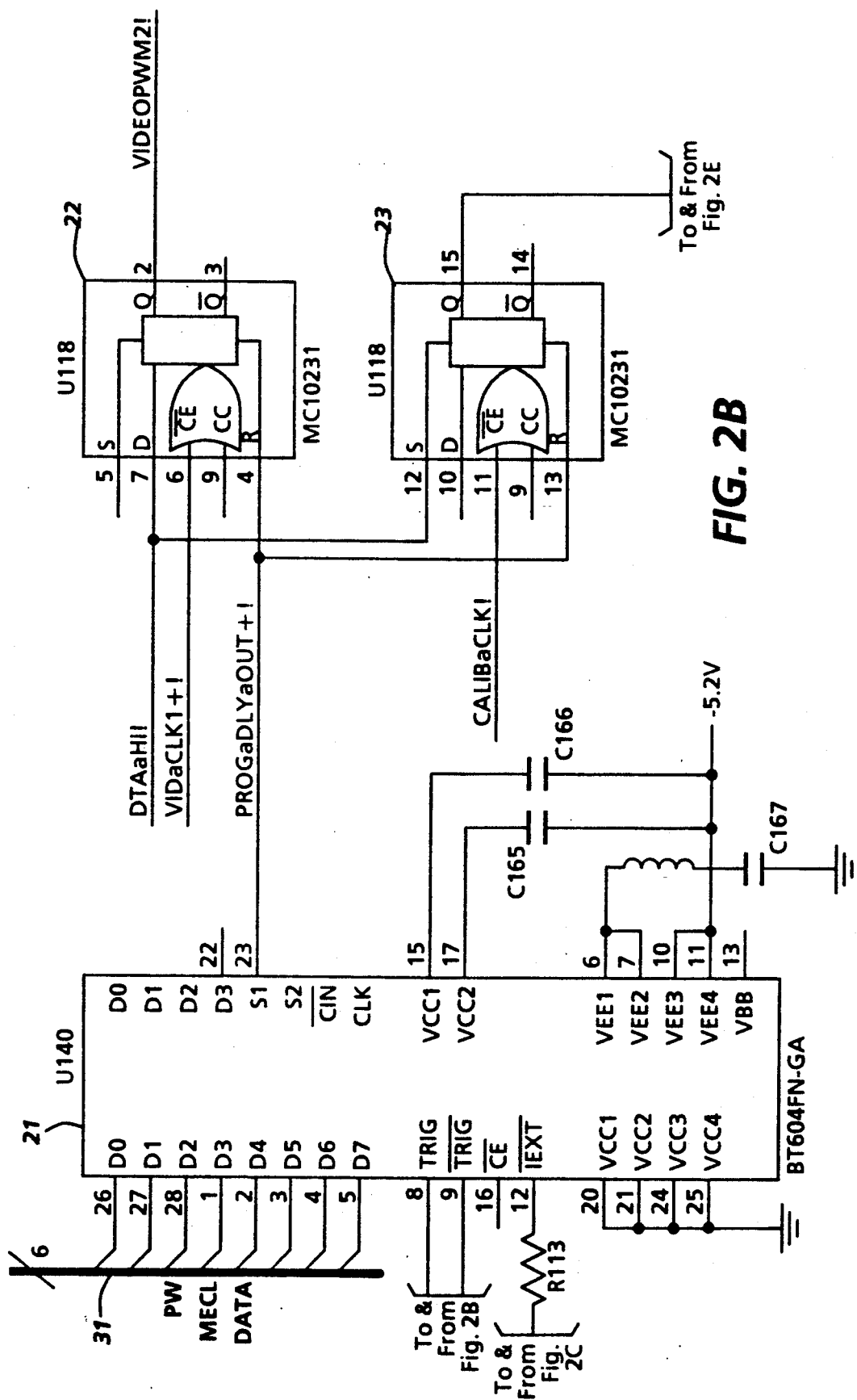
Figure 2C:
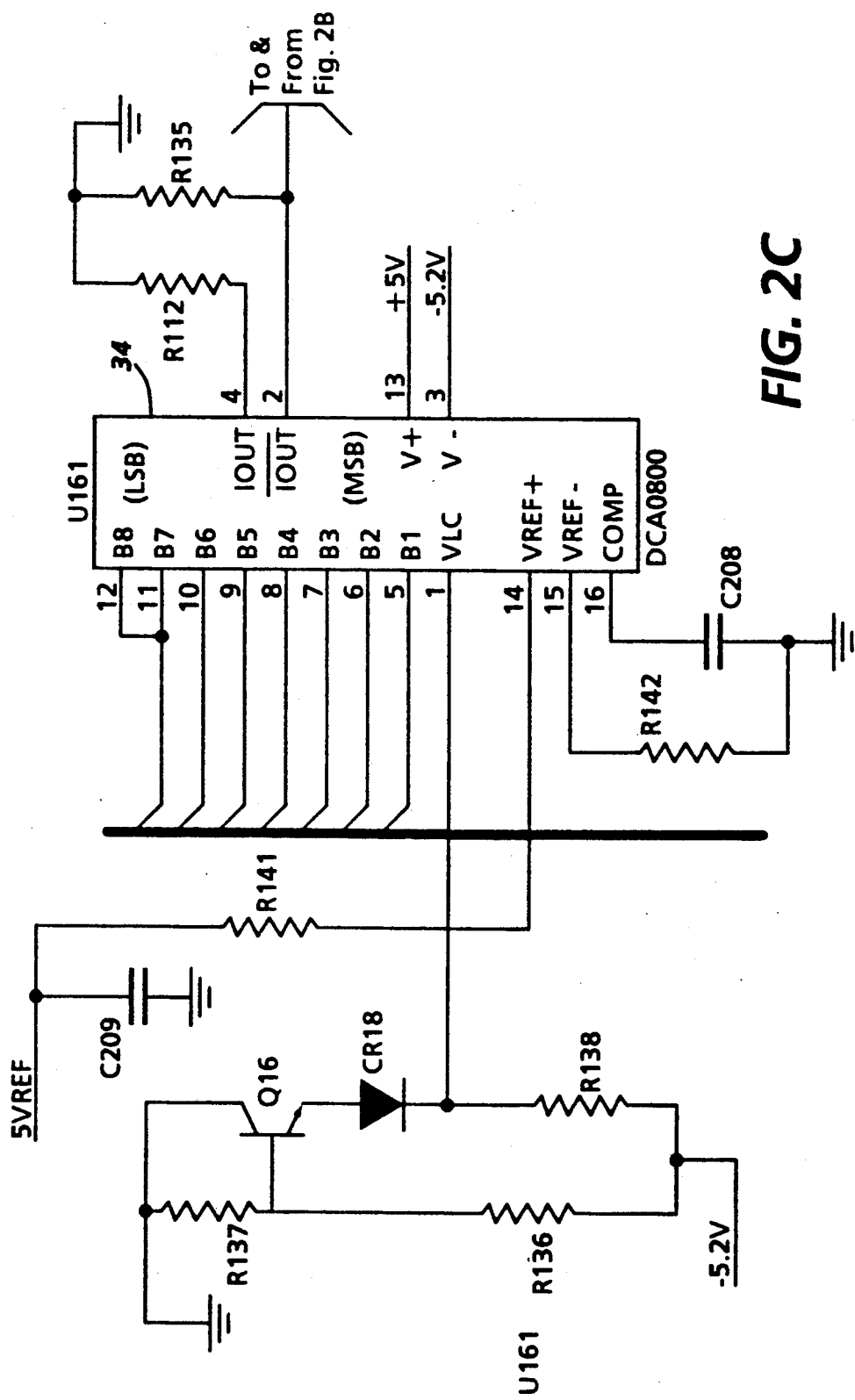
Figure 2D:
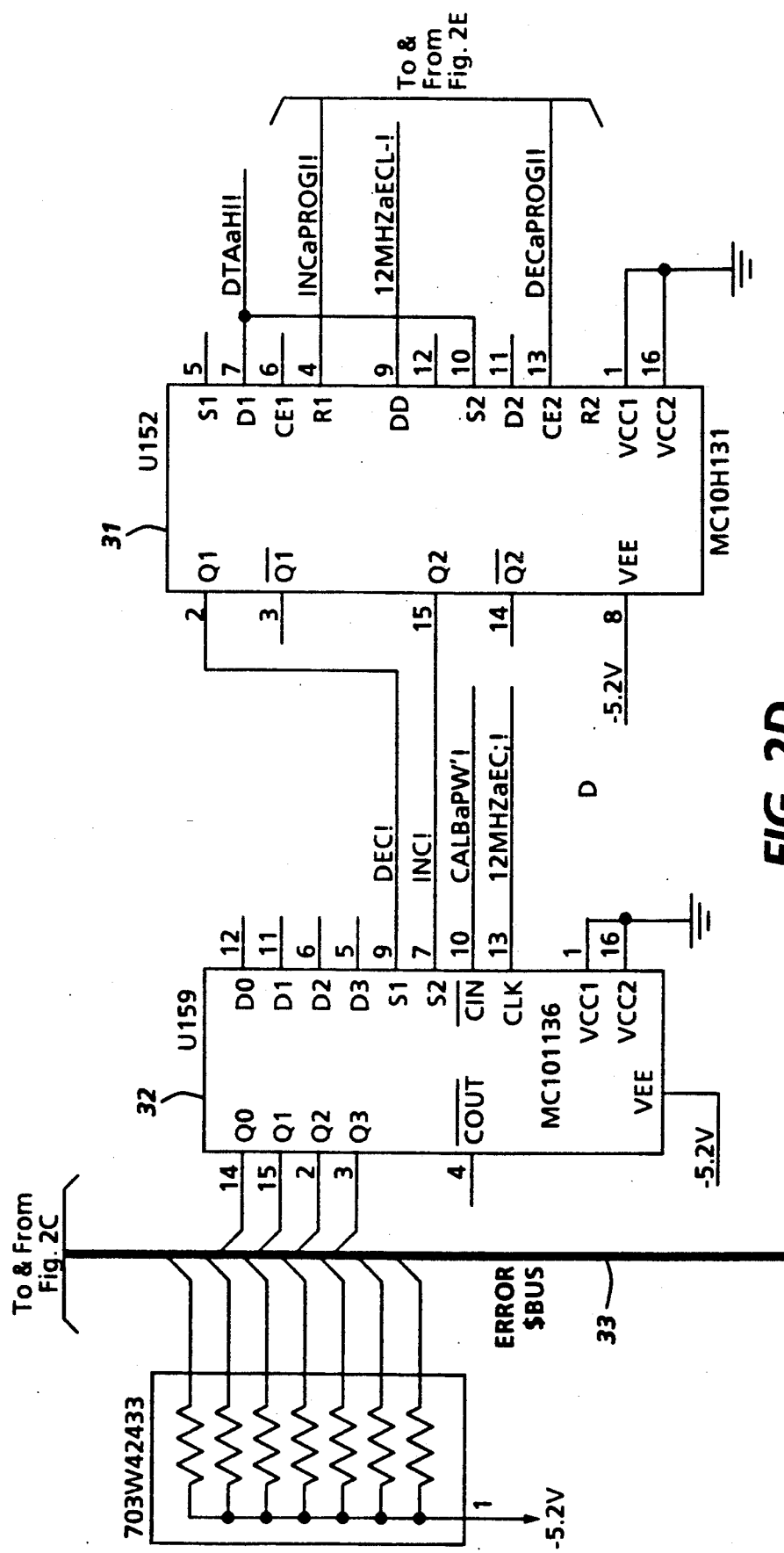
Figure 2E:
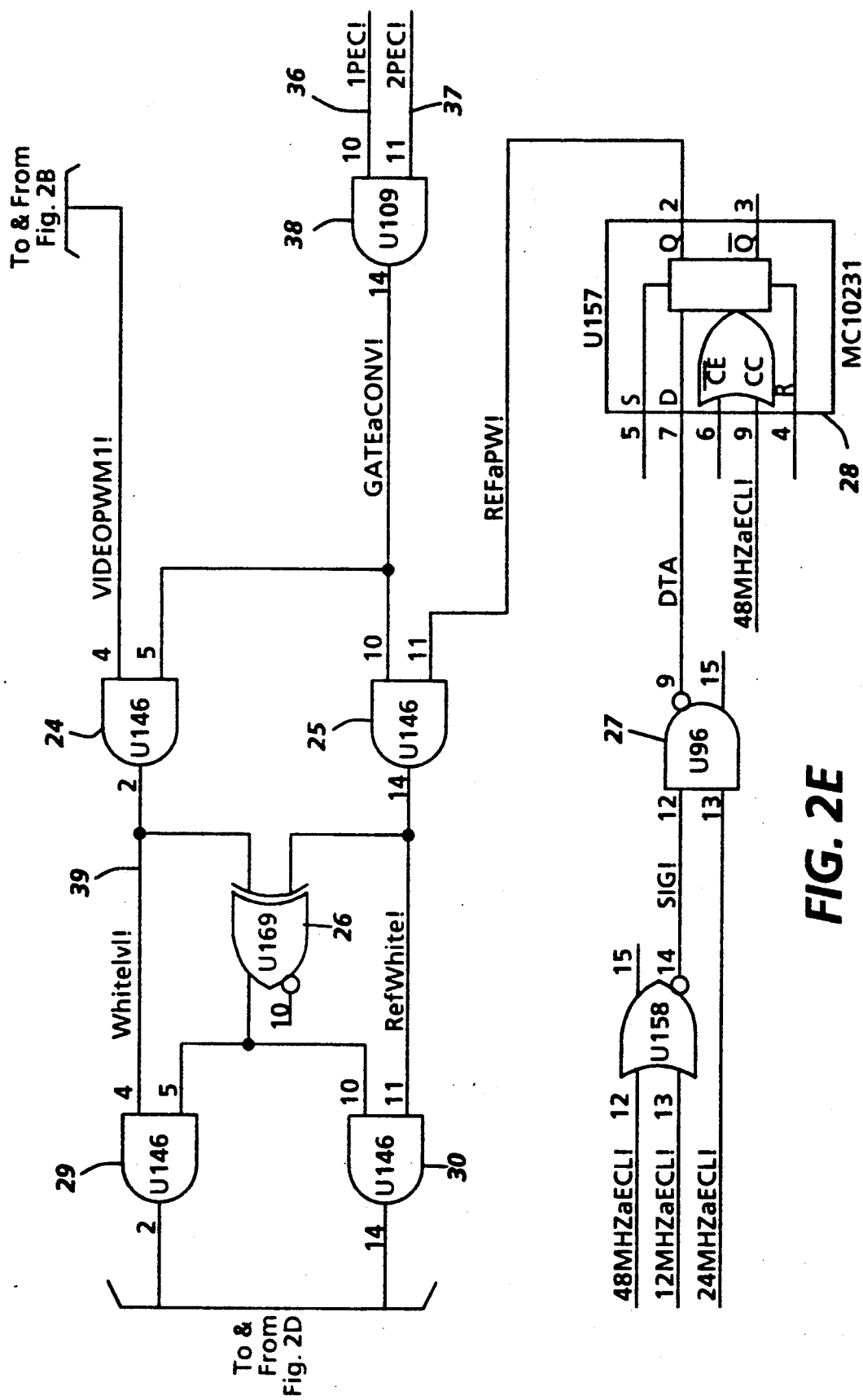

Multiplexer 10 of FIG. 1 is controlled by a control signal that can select the calibrate or digital programming inputs. In calibrate, a six digit binary number is applied, expressing a calibration value. In this discussion the example of 75%, 110000, will be assumed. This six bit number will be applied to the current controlled pulse width modulator 12 which produces a first waveshape.

At the same time, two system clock pulses in the form of square waves, one double the frequency of the other are added in the PWM reference generator 15 to produce a 75% duty cycle second waveshape.

The two waveshapes thus produced are compared at the summer 14, the output either incrementing or decrementing the counter 13. The counter output is converted into an analog current in DAC 11 which controls the current controlled pulse width modulator 12 to produce a slightly larger or smaller duty cycle. After a number of iterations, the output duty cycle of the modulator 12 will be 75%. This concludes the calibration phase.

In actual use, the counter 13 is disabled from changing by the calibration control line, and a digital programming number is applied to the latch 10, to generate the equivalent duty cycle at the output of the modulator 12.

The circuit is shown in more detail in FIG. 2. The six bit calibration number is applied on data bus 20 to a current controlled pulse width modulator 21, a Brooktree part number BT604FN-GA, which produces a delayed pulse on output pin 22. This goes to two latches 22 23, Motorola part number MC10231, which convert this pulse into a waveshape. The output of the first latch 22 goes to the system and is used during regular operation while the output of the second latch 23 goes on through gate 24, Motoral part number MC10104, to the comparator 26, Motorola part number MC10107, to be used in the calibrate mode.

At the same time, a waveshape having a duty cycle of exactly 75% is produced by ANDing two clocks, one twice the system clock frequency, the other four times the system clock frequency. These two clocks are applied to the inputs of gate 27, a Motorola MC10104, which ANDs them. The output is coupled through latch 28, Motorola part number MC10231, and gate 25, Motorola part number 10104, to the other part input of the comparator 26.

The waveshape which arrives first at the comparator will turn its associated gate ON. If it is gate 29, the gate output, coupled through latch 31, Motorola part number MC10H131, will cause the counter 32, Motorola part number MC10136, to increment. If it is gate 30, the gate output will cause the counter 32 to decrement.

The 4 bit output of counter 32 will be coupled through bus 33 to the input of the DAC 34, National part number DAC0800, the output of which is either a greater or lesser amount of current entering output pin 2.

The output of the DAC is connected to a constant current generator resistor 35 which supplies current into pin 12 of the modulator 21. The DAC steals more or less of this current at its output pin 2, thus controlling the modulator.

One added detail of this circuit is that it has been designed to operate on every fourth pixel frame since the DAC can not operate at 80 ns. The basic 6 MHz clock is applied to input line 36 of gate 38, and a clock with double the time period is applied to line 37. The output is a signal which disables the comparator 26 three out of every four cycles.

The overall operation of the circuit during calibration therefore is that after a number of iterations, the counter will finally arrive at a count such that the DAC 34 output current will force the modulator to produce a waveshape having a duty cycle of 75%. The circuit is now calibrated.

For actual use, the counter 32 is disabled by disconnecting its clock so that the circuit will hold its calibrated state, and a six bit data word representing the desired duty cycle number will be supplied to the modulator 21 to generate an output with the actual duty cycle.

Figure 3:
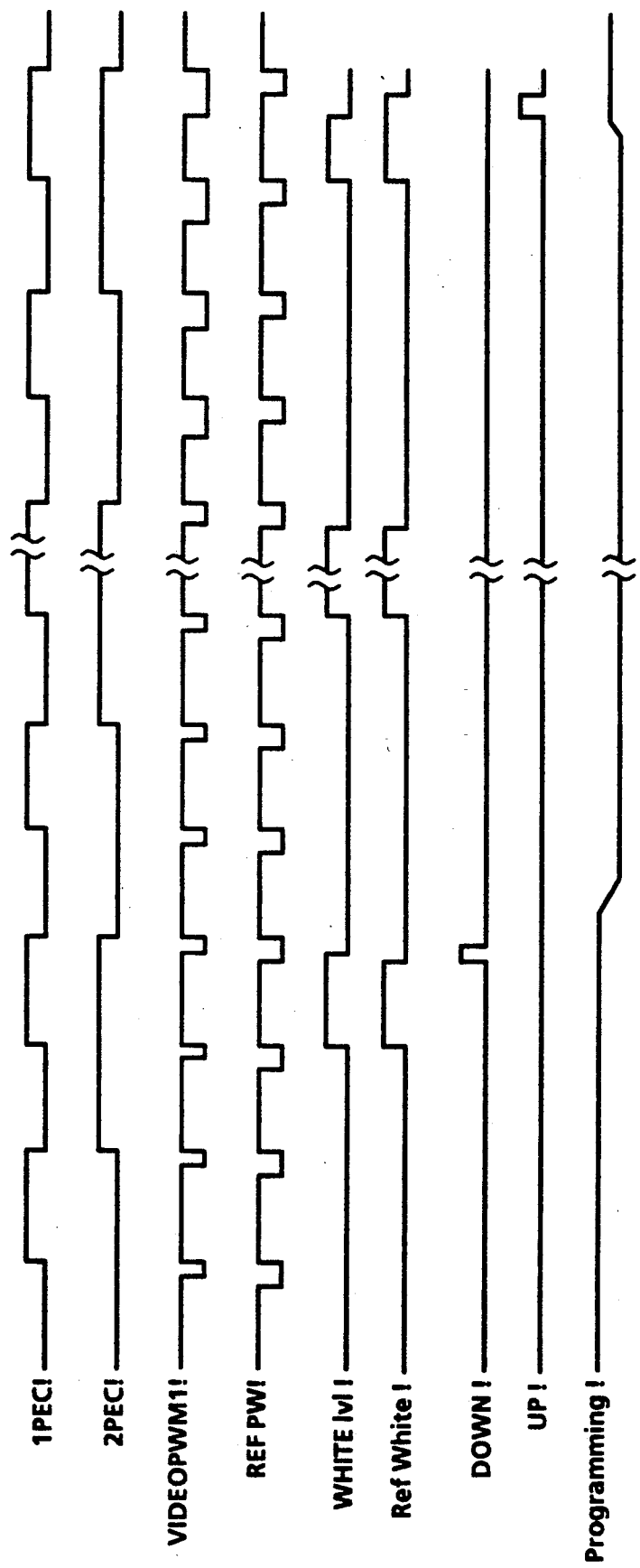
FIG. 3 is a timing diagram.

FIG. 3 is a timing diagram. The first waveshape, 1PEC!, is the 6 MHz system clock. Each positive time duration of the waveshape is one frame or pixel, and each negative duration is the next frame. The second waveshape, 2PEC!, is double the time period, and half the frequency. Not shown are ¼ and ⅛ PEC!, which would be 12 and 24 MHz respectively. The VIDEOPWM1! waveshape is the output pulse of the modulator after being coupled through the latch 23, and is one of the two inputs to the comparator. The other input to the comparator is the FIG. 3 waveshape REF PW, which is the waveshape that is generated by adding the 12 and 24 MHz clocks together. The White lvl! waveshape is the signal of line 39 which was produced from the binary input and which is one of the input lines to the comparator 26. Ref White! is the other input to the comparator, and is produced from the addition of the two clock signals. As shown in FIG. 3, if Ref White! goes negative first, a Down pulse is produced, and if White lvl! goes negative first, an Up! pulse is produced. The Programming 1 waveshape shows the effect the Down and Up pulses ultimately have on the current entering the modulator 21.

While the invention has been described with reference to a specific embodiment, it will be understood by those skilled in the art that various changes may be made and equivalents may be substituted for elements thereof without departing from the true spirit and scope of the invention. In addition, many modifications may be made without departing from the essential teachings of the invention.

I claim:

1. A circuit responsive to a system clock for generating a waveshape which starts at said system clock time and which has a duty cycle which is determined by a binary number input, said circuit also being responsive to an input waveshape which is synchronized with said system clock and which has a duty cycle exactly equal in numerical value to said binary number, said circuit comprising;
   a pulse width modulator responsive to said system clock to produce a pulse width modulated output starting at said system clock time in response to an input of said binary number said pulse width modulated output having an adjustable output duty cycle in response to an electrical analog signal,
   a comparator for comparing the duty cycles of said pulse width modulated output and said input waveshape,
   a counter responsive to said comparator for incrementing or decrementing said counter's count in response to whether the waveshape or the modulated output has a larger duty cycle,
   a DAC responsive to said count to output an analog signal to adjust the output duty cycle of said modulator, and
   means for disabling said counter from further counting so that the output duty cycle will be responsive only to any change of said binary number input.

2. The circuit of claim 1 further comprising a circuit for adding two clocks whose frequencies are multiples of said system clock's frequency to produce said input waveshape.

3. The circuit of claim 1 further comprising a multiplexer comprising a control line, said multiplexer for coupling to said modulator either said binary number which is exactly equal to the fractional value of said waveshape duty cycle or for coupling some other binary number, and
   said control line also being coupled to said counter so that said counter can be disabled from further counting when said other binary number is being applied to said modulator.

* * * * *